US009118180B2

(12) United States Patent
Yasuda et al.

(10) Patent No.: US 9,118,180 B2
(45) Date of Patent: Aug. 25, 2015

(54) INPUT PROTECTION CIRCUIT

(71) Applicant: YOKOGAWA ELECTRIC CORPORATION, Musashino-shi, Tokyo (JP)

(72) Inventors: Kazuhide Yasuda, Musashino (JP); Hiroaki Hagiwara, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 161 days.

(21) Appl. No.: 13/782,623

(22) Filed: Mar. 1, 2013

(65) Prior Publication Data

US 2013/0229740 A1 Sep. 5, 2013

(30) Foreign Application Priority Data

Mar. 2, 2012 (JP) ................................. 2012-046934
Dec. 17, 2012 (JP) ................................. 2012-274206

(51) Int. Cl.
*H02H 3/20* (2006.01)
*H01L 27/02* (2006.01)
*H02H 9/04* (2006.01)

(52) U.S. Cl.
CPC ........... *H02H 3/207* (2013.01); *H01L 27/0285* (2013.01); *H02H 9/046* (2013.01)

(58) Field of Classification Search
USPC .................................................. 361/80, 111
See application file for complete search history.

(56) References Cited

U.S. PATENT DOCUMENTS

| 5,389,811 | A | 2/1995 | Poucher et al. |
| 5,696,659 | A | 12/1997 | Maruo |
| 6,218,819 | B1 | 4/2001 | Tiwari |
| 7,324,315 | B2 * | 1/2008 | Harris .............................. 361/58 |
| 7,576,962 | B2 * | 8/2009 | Harris .............................. 361/58 |
| 7,974,061 | B2 * | 7/2011 | Morrish ........................ 361/111 |
| 2004/0150927 | A1 * | 8/2004 | Strayer et al. ................... 361/82 |
| 2005/0128669 | A1 * | 6/2005 | Harris .......................... 361/91.1 |

(Continued)

FOREIGN PATENT DOCUMENTS

| FR | 2783942 A1 | 3/2000 |
| GB | 2461181 A | 12/2009 |
| WO | 9418736 A1 | 8/1994 |

OTHER PUBLICATIONS

"Design of Mixed-Voltage I/O Buffer by Using NMOS-Blocking Technique", IEEE Journal of Solid-State Circuits, vol. 41,No. 10,pp. 2324-2333, Oct. 2006.

*Primary Examiner* — Rexford Barnie
*Assistant Examiner* — Angela Brooks
(74) *Attorney, Agent, or Firm* — Lowe Hauptman & Ham, LLP

(57) ABSTRACT

An input protection circuit includes: a first transistor of a field-effect type coupled in series between an input terminal and an electronic circuit, the input terminal receiving an input voltage, the electronic circuit receiving an input voltage, the first transistor switching to an off-state in a case where the input voltage is higher than a positive power supply voltage of the electronic circuit; a second transistor of a field-effect type coupled in series between the first transistor and the electronic circuit, the second transistor switching to an off-state in a case where the input voltage is lower than the negative power supply voltage of the electronic circuit; and a voltage control circuit configured to maintain gate-source voltages of the first transistor and the second transistor as voltages within a power supply voltage range of the electronic circuit based on the input voltage.

12 Claims, 5 Drawing Sheets

(56) References Cited

U.S. PATENT DOCUMENTS

| | | | |
|---|---|---|---|
| 2006/0098363 A1* | 5/2006 | Hebert et al. | 361/56 |
| 2006/0158812 A1* | 7/2006 | Harris et al. | 361/111 |
| 2007/0188950 A1* | 8/2007 | Liu et al. | 361/54 |
| 2009/0122456 A1* | 5/2009 | Morrish | 361/111 |
| 2009/0207542 A1* | 8/2009 | Carcouet et al. | 361/58 |
| 2009/0323243 A1* | 12/2009 | Morrish | 361/101 |
| 2010/0123442 A1* | 5/2010 | Peterson et al. | 323/282 |
| 2010/0271069 A1* | 10/2010 | Kim et al. | 326/80 |
| 2012/0293017 A1* | 11/2012 | Lidsky et al. | 307/126 |

* cited by examiner

INPUT PROTECTION CIRCUIT

CROSS-REFERENCE TO RELATED APPLICATION

This application is based on Japanese Patent Application Nos. 2012-46934 filed on Mar. 2, 2012 and 2012-274206 filed on Dec. 17, 2012 with the Japan Patent Office, the entire contents of which are hereby incorporated by reference.

BACKGROUND

1. Technical Field

This disclosure relates to an input protection circuit.

2. Related Art

Some electronic devices such as a voltage measuring device that measures an input voltage with high accuracy include input protection circuits. The input protection circuit protects an internal circuit when an input terminal receives an excessive voltage. FIG. 8 illustrates an exemplary known input protection circuit in an electronic device. An input protection circuit 2 protects a voltage measuring circuit 1 against the excessive input voltage Vin. The voltage measuring circuit 1 receives a positive power supply voltage VDD that is a power supply voltage at a positive electrode side and a negative power supply voltage VSS that is a power supply voltage at a negative electrode side. The voltage measuring circuit 1 measures an analog voltage with high accuracy.

The input protection circuit 2 includes, between an input terminal 3 to which the input voltage Vin is applied and the voltage measuring circuit 1, a Negative channel Metal-Oxide-Semiconductor Field-Effect Transistor (NMOSFET) 4 and Positive channel Metal-Oxide-Semiconductor Field-Effect Transistor (PMOSFET) 5 that are coupled in series. The NMOSFET 4 has a gate terminal to which the positive power supply voltage VDD is applied. The PMOSFET 5 has a gate terminal to which the negative power supply voltage VSS is applied.

The NMOSFET 4 has a drain coupled to the input terminal 3. Its source is coupled to a drain of the PMOSFET 5. The PMOSFET 5 has a source coupled to the voltage measuring circuit 1.

In the case where the input voltage Vin is within a power supply voltage range (VDD to VSS) of the voltage measuring circuit 1, gate-source voltages of the NMOSFET 4 and the PMOSFET 5 change within a range of 0V to VDD+|VSS| corresponding to a value of the input voltage Vin. At this time, the NMOSFET 4 and the PMOSFET 5 are both in the on-state. Accordingly, the input voltage Vin is input to the voltage measuring circuit 1 as Vic through the NMOSFET 4 and the PMOSFET 5. Here, for ease of explanation, the threshold voltages of the MOSFETs 4 and 5 are assumed to be zero V.

In the case where the input voltage Vin becomes higher than the positive power supply voltage VDD of the voltage measuring circuit 1, the NMOSFET 4 becomes off-state. Thus, the input voltage Vin is not input to the voltage measuring circuit 1. In the case where the input voltage Vin becomes larger than the negative power supply voltage VSS of the voltage measuring circuit 1 with respect to a negative electric potential side, the PMOSFET 5 becomes off-state. Thus, the input voltage Vin is not input to the voltage measuring circuit 1. This switching operation protects the voltage measuring circuit 1 against the excessive input voltage. This type of known technique is described in, for example, U.S. Pat. No. 5,389,811.

SUMMARY

An input protection circuit includes: a first transistor of a field-effect type coupled in series between an input terminal and an electronic circuit, the input terminal receiving an input voltage, the electronic circuit receiving an input voltage, the first transistor switching to an off-state in a case where the input voltage is higher than a positive power supply voltage of the electronic circuit; a second transistor of a field-effect type coupled in series between the first transistor and the electronic circuit, the second transistor switching to an off-state in a case where the input voltage is lower than the negative power supply voltage of the electronic circuit; and a voltage control circuit configured to maintain gate-source voltages of the first transistor and the second transistor as voltages within a power supply voltage range of the electronic circuit based on the input voltage.

BRIEF DESCRIPTION OF DRAWINGS

FIG. 5A illustrates one diode coupled in a reverse direction, and FIG. 5B illustrates a plurality of diodes coupled in a forward direction;

DETAILED DESCRIPTION

Figure 1:
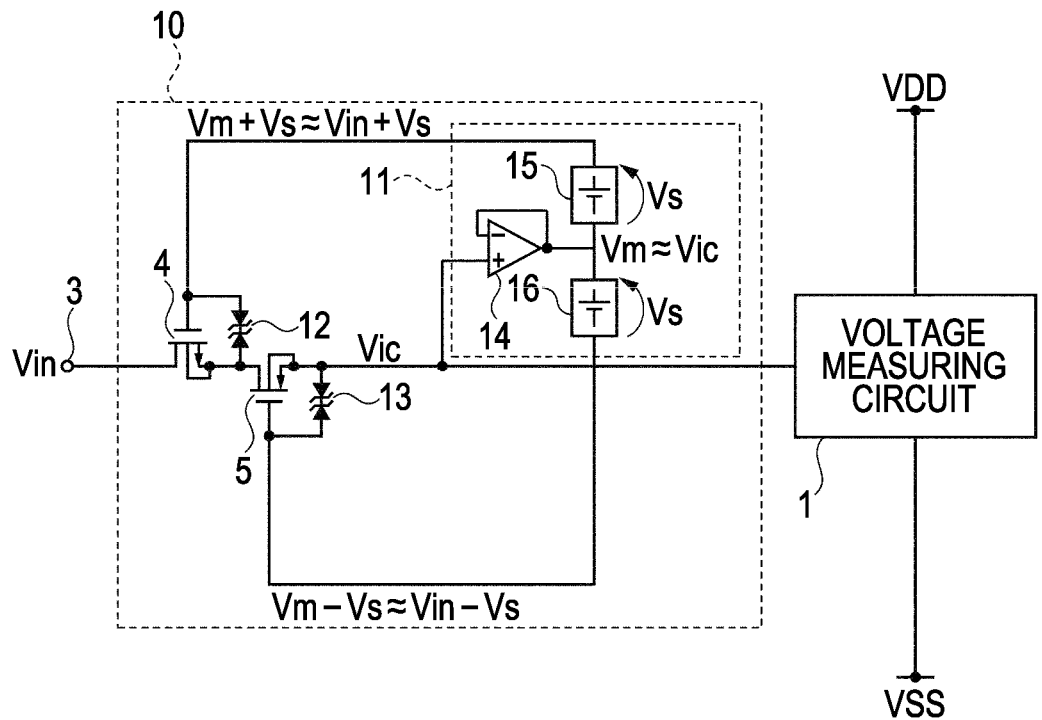
FIG. 1 is a circuit diagram illustrating a circuit configuration of a voltage measuring device that includes a voltage measuring circuit coupled to an input protection circuit according to a first embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 8:
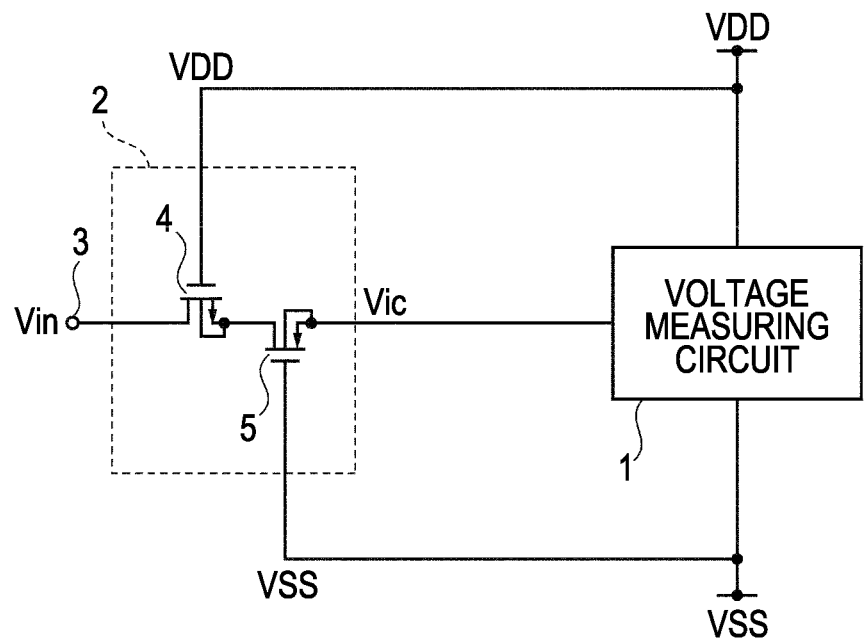
FIG. 8 is a circuit diagram illustrating a voltage measuring device that includes a voltage measuring circuit coupled to a known input protection circuit.

In the input protection circuit 2 indicated in FIG. 8, a gate-source withstand voltage of a typical MOSFET is much lower than a drain-source withstand voltage, and is around 30 V at most. If an applied voltage between the gate and the source exceeds the withstand voltage, the MOSFET will be damaged. Accordingly, the gate-source withstand voltages of the MOSFETs 4 and 5 restricts protection of the voltage measuring circuit 1 against the excessive input voltage Vin.

Figure 9:
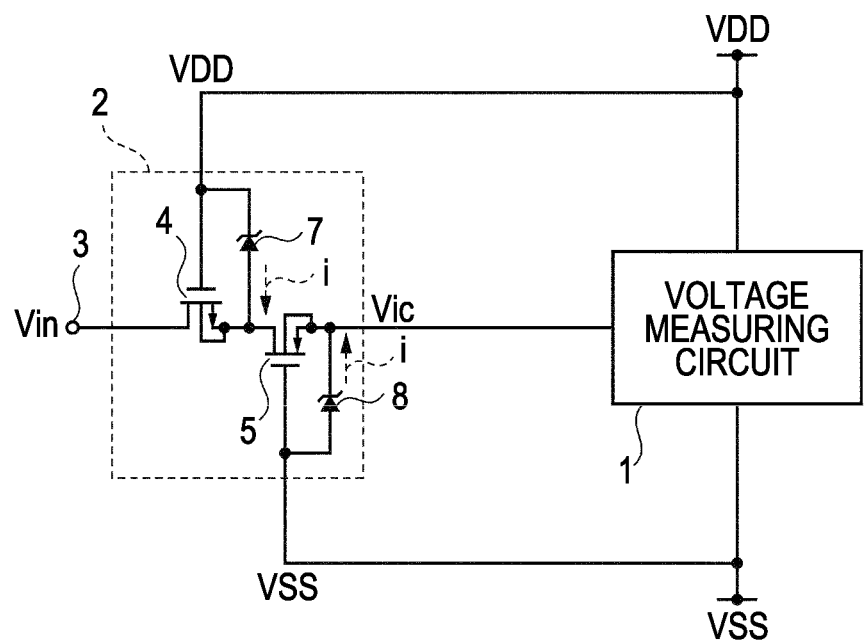
FIG. 9 is a circuit diagram illustrating a voltage measuring device that includes a voltage measuring circuit coupled to another known input protection circuit.

Therefore, in the circuit illustrated in FIG. 9, zener diodes 7 and 8 are coupled between the gate and the source in the MOSFETs 4 and 5. This clamps the gate-source voltage within the withstand voltage.

When the input voltage Vin is applied, a leak current i flows through the zener diode 7 or 8 from the gate side toward the source side. This leak current i exponentially increases when the increased input voltage Vin increases the applied voltage between the gate and the source of the MOSFET. Accordingly, if the input voltage Vin increases only a little, the leak current significantly increases. A circuit for measuring an analog voltage with high accuracy like the voltage measuring circuit 1 has difficulty in permitting this increase in leak current. That is, this increase in leak current adversely affects the circuit.

One object of this disclosure is to provide an input protection circuit that allows a protection between a gate and a source of a field effect transistor against an excessive input voltage. Additionally, another object of this disclosure is to provide an input protection circuit that reduces leak current that flows between a gate and a source through a diode.

Hereinafter, by referring to the accompanying drawings, an embodiment of this disclosure will be described in detail.

Configuration of a First Embodiment

FIG. 1 illustrates a circuit configuration of a voltage measuring device that includes a voltage measuring circuit (an electronic circuit) 1 according to a first embodiment. The voltage measuring circuit 1 is coupled to an input protection circuit 10 according to the first embodiment. The voltage measuring circuit 1 receives a positive power supply voltage VDD that is a power supply voltage at a positive electrode side and a negative power supply voltage VSS that is a power supply voltage at a negative electrode side. The voltage measuring circuit 1 measures an analog voltage with high accuracy.

The input protection circuit 10 is disposed between the input terminal 3 to which the input voltage Vin is applied and the voltage measuring circuit 1. The input protection circuit 10 includes the NMOSFET 4, the PMOSFET 5, zener diodes 12 and 13, and a voltage shift circuit 11.

The NMOSFET (a first transistor) 4 and the PMOSFET (a second transistor) 5 are coupled between the input terminal 3 and the voltage measuring circuit 1 in series. The NMOSFET 4 has a drain coupled to the input terminal 3. The NMOSFET 4 has a source coupled to a drain of the PMOSFET 5. The PMOSFET 5 has a source coupled to the voltage measuring circuit 1.

The NMOSFET 4 becomes off-state in the case where the input voltage Vin is higher than the positive power supply voltage of the voltage measuring circuit 1. The PMOSFET 5 becomes off-state in the case where the input voltage Vin is lower than the negative power supply voltage of the voltage measuring circuit 1.

The zener diode (a first diode) 12 is coupled between the gate and the source of the NMOSFET 4. The zener diode (a second diode) 13 is coupled between a gate and a source of the PMOSFET 5. The voltage shift circuit 11 is coupled between: a coupling line for the source of the PMOSFET 5 and the voltage measuring circuit 1, and respective gate terminals of MOSFETs 4 and 5.

The voltage shift circuit (a voltage control circuit) 11 includes: a voltage buffer 14 that includes an operational amplifier, and level-shift circuits 15 and 16. The voltage buffer 14 has a non-inverting input terminal (+) coupled to a coupling line for the source terminal of the PMOSFET 5 and the voltage measuring circuit 1. The voltage buffer 14 has an inverting input terminal (−) coupled to an output terminal.

The voltage buffer 14 monitors an input voltage Vic to the voltage measuring circuit 1. If an output voltage of the voltage buffer 14 is assumed to be Vm, Vm≈Vic is satisfied.

The level-shift circuit (a first level-shift circuit) 15 is coupled between the output terminal of the voltage buffer 14 and the gate terminal of the NMOSFET 4. The level-shift circuit 15 shifts an input voltage to a positive electric potential side by a predetermined voltage (a level-shift voltage) Vs. Accordingly, the level-shift circuit 15 outputs Vm+Vs (≈Vin+Vs) that is a sum of the output voltage Vm of the voltage buffer 14 and Vs. This voltage is applied to the gate terminal of the NMOSFET 4.

The level-shift circuit (a second level-shift circuit) 16 is coupled between the output terminal of the voltage buffer 14 and the gate terminal of the PMOSFET 5. The level-shift circuit 16 shifts an input voltage to a negative electric potential side by the predetermined voltage (the level-shift voltage) Vs. Accordingly, the level-shift circuit 16 outputs a voltage of Vm−Vs (≈Vin−Vs) that is a difference between the output voltage Vm of the voltage buffer 14 and Vs. This voltage is applied to the gate terminal of the PMOSFET 5.

In this configuration, the gate-source voltage of the NMOSFET 4 is a reverse-bias voltage (the predetermined voltage Vs) of the zener diode 12. Vs is set to be lower than the positive power supply voltage VDD. On the other hand, the gate-source voltage of the PMOSFET 5 is a reverse-bias voltage of the zener diode 13. This reverse-bias voltage is −Vs. −Vs is set to be higher than the negative power supply voltage VSS. That is, Vs is lower than the positive power supply voltage VDD and higher than the negative power supply voltage VSS. Accordingly, gate-drain voltages from +Vs to −Vs in the MOSFETs 4 and 5 are set to a voltage value within the power supply voltage range (VDD to VSS).

Accordingly, the voltage shift circuit 11 sets gate potentials of the MOSFETs 4 and 5 by tracking Vic, which is the input voltage Vin, (that is, based on Vic, which is the input voltage Vin). Thus, the voltage shift circuit 11 maintains the gate-source voltages of the MOSFETs 4 and 5 constant and voltage values within the power supply voltage range (VDD to VSS).

Operation of the First Embodiment

Hereinafter, operation of the input protection circuit 10 according to the first embodiment illustrated in FIG. 1 will be described in detail. In the case where the input voltage Vin is within the power supply voltage range (VDD to VSS) of the voltage measuring circuit 1, the magnitudes of the gate-source voltages of the NMOSFET 4 and the PMOSFET 5 become a predetermined voltage |Vs| regardless of the input voltage Vin. However, the predetermined voltage |Vs| is set to a minimum value to turn on the NMOSFET 4 and the PMOSFET 5. Accordingly, in the case where the input voltage Vin is within the power supply voltage range (VDD to VSS), the NMOSFET 4 and the PMOSFET 5 are on-state. The voltage Vic is input to the voltage measuring circuit 1 through these MOSFETs 4 and 5. Consequently, the voltage measuring circuit 1 measures the input voltage Vin with high accuracy.

In the case where the input voltage Vin is higher than the positive power supply voltage VDD of the voltage measuring circuit 1, the NMOSFET 4 becomes off-state. Thus, the input voltage Vin is not input to the voltage measuring circuit 1. In the case where the input voltage Vin becomes larger than the negative power supply voltage VSS of the voltage measuring circuit 1 at the negative electric potential side, the PMOSFET 5 becomes off-state. Accordingly, the input voltage Vin is not input to the voltage measuring circuit 1. This switching operation protects the voltage measuring circuit 1 against an excessive input voltage.

When the input voltage Vin exceeds the power supply voltage range (VDD to VSS) of the voltage measuring circuit 1 and becomes further larger at the positive electric potential side and the negative electric potential side, the gate-source voltage of the NMOSFET 4 or the PMOSFET 5 also becomes larger. These gate-source voltages are clamped by the zener diodes 12 and 13 before exceeding the respective gate-source withstand voltages.

In this respect, the gate-source voltages of the MOSFETs 4 and 5, which are the reverse-bias voltages of the zener diodes 12 and 13, are maintained at voltages within the power supply voltage range (VDD to VSS). This reduces the reverse-bias voltage compared with the configuration where the power supply voltage VDD or VSS is applied to the gate terminal of the MOSFET like the known technique. This reduces the leak currents that flow through the zener diodes 12 and 13.

Advantageous Effect of the First Embodiment

As described above, in the input protection circuit 10 according to the first embodiment, the input terminal 3 receives the input voltage Vin. The voltage measuring circuit 1 receives the applied voltage Vic. Between the input terminal 3 and the voltage measuring circuit 1, at least two field-effect type transistors of the NMOSFET 4 and the PMOSFET 5 are coupled in series. In the case where the input voltage Vin becomes out of the range of the power supply voltage of VDD to VSS in the voltage measuring circuit 1, one of the MOSFETs 4 and 5 is turned off. This prevents inputting an excessive voltage to the voltage measuring circuit 1.

In the input protection circuit 10, the zener diode 12 is coupled between the gate and the source of the NMOSFET 4. Additionally, the zener diode 13 is coupled between the gate and the source of the PMOSFET 5. The input protection circuit 10 further includes the voltage shift circuit 11. By tracking Vic, which is the input voltage Vin (that is, based on Vic, which is the input voltage Vin), the voltage shift circuit 11 generates the gate potentials of the MOSFETs 4 and 5 so as to maintain the gate-source voltages of the MOSFETs 4 and 5 constant and voltage values within the power supply voltage range (VDD to VSS).

With this configuration, the reverse-bias voltages of the zener diodes 12 and 13 become the gate-source voltages of the MOSFETs 4 and 5. This voltage is the voltage Vs within the power supply voltage range. This reduces the reverse-bias voltages compared with the configuration where the power supply voltage (VDD to VSS) is applied to the gate terminals of the MOSFETs 4 and 5 like the known technique. This reduces the leak currents that flow through the zener diodes 12 and 13. Therefore, this reduces an exponential increase in leak current in association with increase in input voltage Vin and a negative effect, for example, on the voltage measuring circuit 1 that measures the analog voltage with high accuracy due to this increase, like the known technique. Additionally, the zener diodes 12 and 13 provide protection between the gate and the source of the MOSFETs 4 and 5.

Configuration of a Second Embodiment

Figure 2:
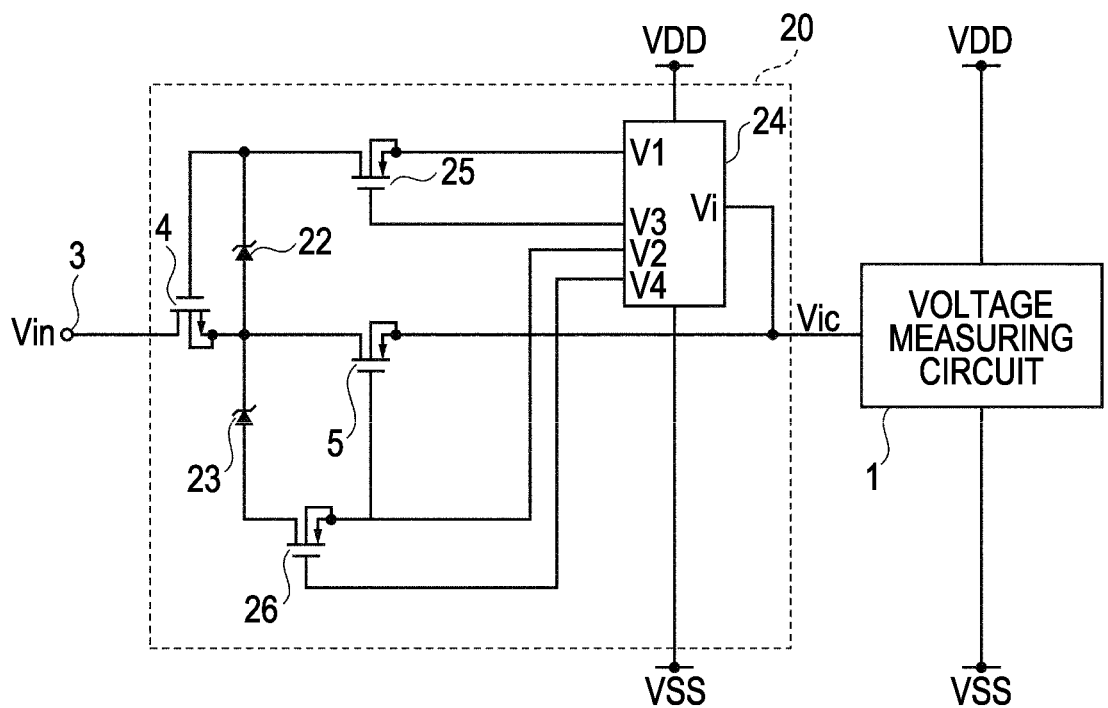
FIG. 2 is a circuit diagram illustrating a circuit configuration of a voltage measuring device that includes a voltage measuring circuit coupled to an input protection circuit according to a second embodiment.

FIG. 2 illustrates a circuit configuration of a voltage measuring device that includes a voltage measuring circuit 1 according a second embodiment. The voltage measuring circuit 1 is coupled to an input protection circuit 20 according to the second embodiment. The input protection circuit 20 is disposed between the input terminal 3 to which the input voltage Vin is applied and the voltage measuring circuit 1. The input protection circuit 20 includes the NMOSFET 4, the PMOSFET 5, a gate bias circuit 24, PMOSFETs 25 and 26, and zener diodes 22 and 23.

The NMOSFET 4 and the PMOSFET 5 are coupled between the input terminal 3 and the voltage measuring circuit 1 in series.

The gate bias circuit (the voltage control circuit) 24, the PMOSFET (a fourth transistor) 25, and the PMOSFET (a third transistor) 26 are coupled between: a coupling line for the source terminal of the PMOSFET 5 and the voltage measuring circuit 1, and the gate terminals of the MOSFETs 4 and 5.

The zener diode (the first diode) 22 is coupled between the gate and the source of the NMOSFET 4. The zener diode (the second diode) 23 is coupled between the gate and the drain of the PMOSFET 26.

Figure 3:
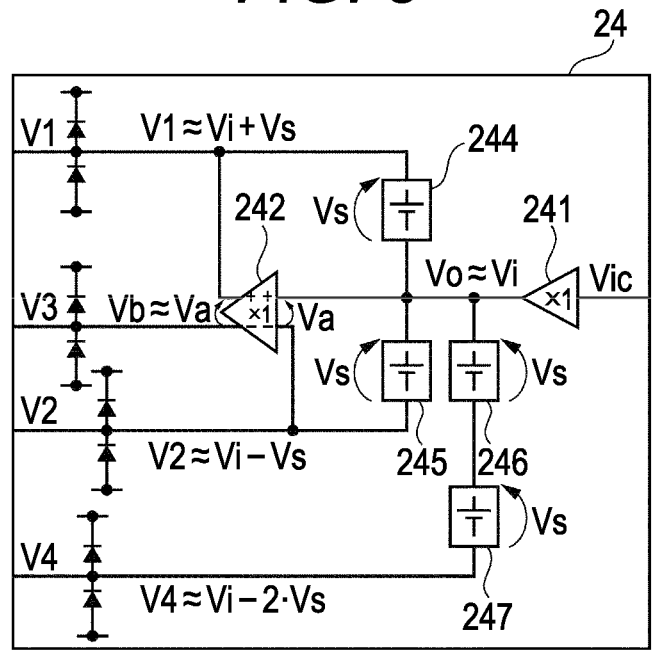
FIG. 3 is a circuit diagram illustrating a configuration of a gate bias circuit in the input protection circuit according to the second embodiment.

The gate bias circuit (a gate driver circuit) 24 includes, as illustrated in FIG. 3, voltage buffers 241 and 242, and level-shift circuits 244, 245, 246, and 247. Output terminals of voltages V1, V2, V3 and V4 are coupled between the power supply and the ground through diodes.

The voltage buffer (a first voltage buffer) 241 monitors the voltage Vic corresponding to the input voltage Vin input through the MOSFETs 4 and 5, and outputs the voltage Vic as a voltage Vo.

The level-shift circuit (the first level-shift circuit) 244 shifts the voltage Vo output from the voltage buffer 241 to the positive electric potential side by the first predetermined voltage Vs (Vic+Vs). The level-shift circuit 244 outputs the voltage obtained by this shifting as the voltage V1 to the source terminal of the PMOSFET 25. The level-shift circuit 245 shifts the voltage Vo to the negative electric potential side by the predetermined voltage Vs (Vic−Vs).

The level-shift circuit (the second level-shift circuit) 245 outputs the voltage obtained by this shifting as the voltage V2 to the source terminal of the PMOSFET 26.

The voltage buffer (the second voltage buffer) 242 has two input terminals. One input terminal is coupled to the output terminal of the voltage buffer 241. The other input terminal is coupled to the output terminal of the level-shift circuit 245. The voltage buffer 242 has two output terminals. One output terminal is coupled to the output terminal of the level-shift circuit 244. The other output terminal outputs the voltage V3. The voltage buffer 242 sets, at the input side, the output voltage V3 to a value obtained by shifting the output voltage V1 of the level-shift circuit 244 by the electric potential Va. Accordingly, the voltage buffer 242 sets, at the output side, the output voltage V3 to a value obtained by shifting the output voltage V1 by the second predetermined voltage Vb (here, Vb≈Va). The first predetermined voltage Vs and the second predetermined voltage Vb are lower than the positive power supply voltage VDD of the voltage measuring circuit 1 and higher than the negative power supply voltage VSS.

With this operation, in the PMOSFET 5, a potential difference Vic−V2 between the voltage Vic supplied to the source terminal and the voltage V2 supplied to the gate terminal becomes Va. On the other hand, in the PMOSFET 25, a potential difference V1−V3 between the voltage V3 supplied to the gate terminal and the voltage V1 supplied to the source terminal becomes Vb.

The level-shift circuit (a third level-shift circuit) 246 and the level-shift circuit (the fourth level-shift circuit) 247 each shift the voltage Vo output from the voltage buffer 241 by the predetermined voltage Vs to the negative electric potential side (Vic−2×Vs). The level-shift circuits 246 and 247 output the voltage obtained by this shifting as the voltage V4 to the gate terminal of the PMOSFET 26.

Accordingly, the gate bias circuit 24 generates the voltage V1 to V4 by tracking the input voltage Vic (≈the input voltage Vin) (that is, based on the input voltage Vic (≈the input voltage Vin)) so as to set the gate-source voltages of the MOSFETs 4 and 5 and the PMOSFETs 25 and 26 to the constant value Vs. However, the voltage V1 to V4 output from the gate bias circuit 24 is set within the power supply voltage range of VDD to VSS. Additionally, these voltages are set such that a relationship where V1−V3≈Vic−V2 is satisfied. That is, the gate-source voltage (V1−V3) of the PMOSFET 25 where the voltages V1 and V3 are applied is almost always maintained to be approximately equal to the gate-source voltage (Vic−V2) of the PMOSFET 5.

In the case where the input voltage Vin is within the range of the power supply voltage of VDD−Vs to VSS+2Vs, the voltage V1 to V4 satisfies the above-described relationships of V1≈Vic+Vs, V2≈Vic−Vs, V3≈Vic, and V4≈Vic−2Vs.

On the other hand, in the case where the input voltage Vin is out of the range of the power supply voltage of VDD−Vs to VSS+2V, for example, in the case where the input voltage Vin becomes equal to or more than VDD−Vs (in the case where the input voltage Vin is high at the positive electric potential side), V1=VDD is satisfied. In the case where the input voltage Vin becomes equal to or less than VSS+2Vs (in the case where the input voltage Vin is low at the negative electric potential side), V4=VSS is satisfied. In the case where the input voltage Vin is equal to or less than VSS+Vs (in the case where the input voltage Vin is low at the negative electric potential side), V2=VSS and V3=V1 are satisfied.

Operation of the Second Embodiment

Hereinafter, operation of the input protection circuit 20 according to the second embodiment illustrated in FIG. 2 will be described in detail. In the case where the input voltage Vin is within the power supply voltage range VDD−Vs to VSS+2Vs, the gate-source voltages of the PMOSFETs 25 and 26 are maintained at the constant value Vs. The PMOSFETs 25 and 26 are turned on, and maintained at low resistance. In this case, the PMOSFETs 25 and 26 each have small voltage drops. Accordingly, the gate bias circuit 24 has the output voltages V1 and V2 at unchanged levels, which are applied to the gate terminals of the respective MOSFETs 4 and 5. This maintains the gate-source voltages of the MOSFETs 4 and 5 at the constant value Vs. The MOSFETs 4 and 5 also are turned on, and maintained at low resistance. When the MOSFETs 4 and 5 become on-state, the input voltage Vin is input to the voltage measuring circuit 1. Consequently, the voltage measuring circuit 1 measures an analog voltage with high accuracy with respect to the input voltage Vin.

In the case where the input voltage Vin is equal to or more than VDD−Vs, the NMOSFET 4 is turned off. Accordingly, the input voltage Vin is not input to the voltage measuring circuit 1. On the other hand, in the case where the input voltage Vin is equal to or less than VSS+2Vs, a drain-bulk parasitic diode is formed in a forward direction. Accordingly, the NMOSFET 4 remains at low resistance. On the other hand, the PMOSFET 5 is turned off. Thus, the input voltage Vin is not input to the voltage measuring circuit 1. Consequently, the voltage measuring circuit 1 is protected against an excessive input voltage.

When the input voltage Vin becomes lower than VSS+2Vs at the negative electric potential side, the gate-source voltage of the NMOSFET 4 becomes higher. At this time, the zener diode 22 clamps the gate-source voltage of the NMOSFET 4 such that the gate-source voltage of the NMOSFET 4 does not exceed the withstand voltage. When the input voltage Vin is equal to or less than VSS+2Vs, the PMOSFETs 25 and 26 become off-state similarly to the PMOSFET 5. In this case, even if the zener diode 22 performs clamping, the PMOSFET 25 becomes off-state (at high-resistance). This restricts the output current of the gate bias circuit 24. Consequently, the gate bias circuit 24 is protected so as not to receive an excessive current flow.

That is, when the input voltage Vin is a negative excessive input, the input voltage Vic to the gate bias circuit 24 and the output voltages V2 and V4 are reduced to satisfy V2≈V4≈Vic≈VSS. Additionally, V3≈V1 is satisfied. Consequently, the gate-source voltage of the PMOSFET 5 becomes 0 V. Thus, the PMOSFET 5 becomes off-state at high resistance. Similarly, the gate-source voltages of the PMOSFETs 25 and 26 become 0 V. Thus, the PMOSFETs 25 and 26 become off-state at high resistance.

Thus, the PMOSFETs 25 and 26 are PMOSFETs for limiting current coupled to the zener diodes 22 and 23 in series. These become at high resistance when the excessive input voltage Vin is input. Accordingly, the voltage measuring circuit 1 is protected against the excessive input voltage Vin. Furthermore, high input resistance is maintained against the excessive input voltage.

Figure 4:
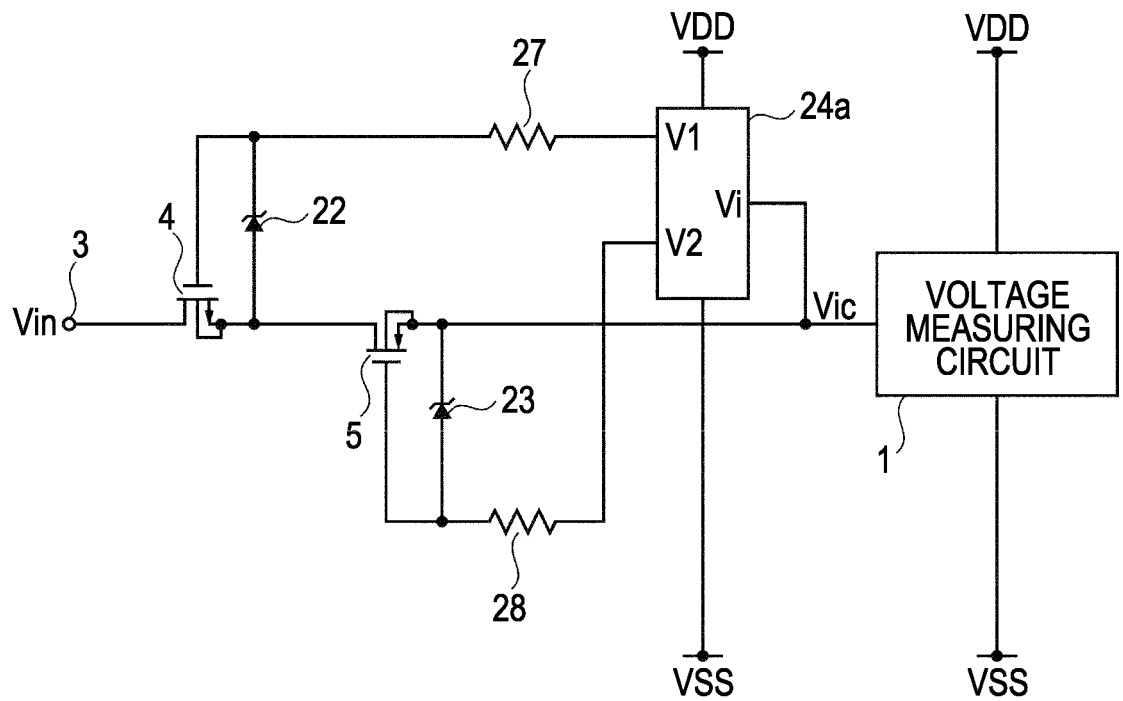
FIG. 4 is a circuit diagram illustrating a circuit configuration of a voltage measuring device that includes a general input protection circuit corresponding to the input protection circuit according to the second embodiment.

In the configuration illustrated in FIG. 2, the zener diode 23 is coupled between the gate and the drain of the PMOSFET 26 for limiting current. In this respect, in a general circuit configuration, as illustrated in FIG. 4, the zener diode 23 is coupled between the gate and the source of the PMOSFET 5. However, in the circuit of FIG. 4, the gate bias circuit 24a generates the voltages V1 and V2 by tracking the input voltage Vic (that is, based on the input voltage Vin). This voltage V1 is applied to the gate terminal of the NMOSFET 4 through a resistor 27. On the other hand, the voltage V2 is applied to the gate terminal of the PMOSFET 5 through a resistor 28.

Like the circuit of FIG. 2, coupling the zener diode 23 between the gate and the drain of the PMOSFET 26 allows the PMOSFET 26 for limiting current to be at high resistance when the excessive input voltage Vin is input.

As illustrated in FIG. 2, coupling the zener diode 23 between the gate and the drain of the PMOSFET 26 makes, compared with the circuit configuration illustrated in FIG. 4, the reverse-bias voltages of the zener diode 22 and the zener diode 23 equal to each other at a normal operation compared with the above-described general circuit configuration. Accordingly, making the reverse-bias voltages of the zener diodes 22 and 23 equal to each other as much as possible reduces input leak current generated due to unbalanced leak currents at the zener diodes 22 and 23.

Advantageous Effect of the Second Embodiment

As described above, the input protection circuit 20 according to the second embodiment is disposed between the input terminal 3 to which the input voltage Vin is applied and the voltage measuring circuit 1. The voltage measuring circuit 1 receives the voltage Vic corresponding to the input voltage Vin. The input protection circuit 20 has at least two MOSFETs 4 and 5. The NMOSFET 4 and the PMOSFET 5 are coupled between the input terminal 3 and the voltage measuring circuit 1 in series. The NMOSFET 4 is disposed at the input terminal 3 side. The PMOSFET 5 is disposed at the voltage measuring circuit 1 side. In the case where the input voltage Vin becomes out of the power supply voltage range of the voltage measuring circuit 1, one of the MOSFETs 4 and 5 is turned off. This suppresses the excessive voltage input to the voltage measuring circuit 1.

The input protection circuit 20 further includes the PMOSFETs 25 and 26, the zener diodes 22 and 23, and the gate bias circuit 24. The PMOSFET 25 has the drain terminal coupled to the gate terminal of the NMOSFET 4. The PMOSFET 26 has the drain terminal coupled to the coupling line between the MOSFETs 4 and 5. The PMOSFET 26 has the source terminal coupled to the gate terminal of the PMOSFET 5. The zener diode 22 is coupled between the gate and the source of the NMOSFET 4. The zener diode 23 is coupled between the gate and the drain of the PMOSFET 26. The gate bias circuit 24 generates the gate-source voltages of the PMOSFETs 25 and 26 by tracking the input voltage Vin (that is, based on the input voltage Vin) such that the gate-source voltages of the MOSFETs 4 and 5 become constant and the gate-source voltage of the PMOSFETs 25 and 26 become constant. In the case where the input voltage Vin becomes out of the power supply voltage range from VDD−Vs to VSS+2Vs of the voltage measuring circuit 1, the gate bias circuit 24 generates the gate-source voltages V1 and V3 for turning off the PMOSFET 25 and the gate-source voltages V2 and V4 for turning off the PMOSFET 26.

In the input protection circuit 20, in the case where the input voltage Vin becomes out of the power supply voltage from VDD−Vs to VSS+2Vs (in the case of the excessive input voltage Vin), the PMOSFETs 25 and 26 for limiting current becomes at high resistance. In this case, the MOSFETs 4 and 5 interposed into a path of the input voltage Vin to the voltage measuring circuit 1 also become at high resistance. This restricts input of the excessive input voltage Vin to the voltage measuring circuit 1. This protects the voltage measuring circuit 1.

Thus, when the excessive input voltage Vin is input, the PMOSFETs 25 and 26 become at high resistance. In the input protection circuit 20, with this effect, the zener diode 23 is coupled between the gate and the drain of the PMOSFET 26 for limiting current. In the general circuit configuration, the zener diode 23 is coupled, as illustrated in FIG. 4, between the gate and the source of the PMOSFET 5. Like the input protection circuit 20, coupling the zener diode 23 between the gate and the drain of the PMOSFET 26 makes the reverse-bias voltages of the zener diode 22 and the zener diode 23 equal to each other at a normal operation compared with the above-described general circuit configuration. Accordingly, making the reverse-bias voltages of the zener diodes 22 and 23 equal to each other as much as possible reduces input leak current generated due to unbalanced leak currents at the zener diode 22 and the zener diode 23.

Figure 5A:
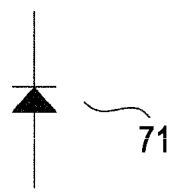
FIG. 5A and FIG. 5B illustrate PN junction diodes interchangeable with a zener diode.
Figure 5B:
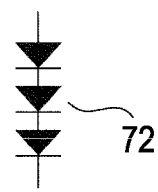

As described above, the zener diodes 12, 13, 22, and 23 illustrated in the first and second embodiments may have any configuration insofar as the zener diodes 12, 13, 22, and 23 suppress the gate-source voltage of the NMOSFET 4 within the withstand voltage. These zener diodes may be a general PN junction diode 71, as illustrated in FIG. 5A, coupled between the gate and the source or between the gate and the drain of the MOSFET in the reverse direction. This ensures the circuit configuration using a reverse direction characteristic of the PN junction diode 71. As illustrated in FIG. 5B, these zener diodes may be a row of diodes 72 with a plurality of PN junction diodes coupled in series between the gate and the source or between the gate and the drain of the MOSFET in the forward direction. The diode 71 and a row of diodes 72 are easily formed as an IC compared with the special zener diodes 22 and 23.

Here, in the above-described second embodiment, the gate bias circuit 24 generates a gate bias voltage (the gate-source voltage of the PMOSFETs 25 and 26) by tracking the input voltage Vi (that is, based on the input voltage Vin). In view of this, a plurality of voltage buffers (the voltage buffers 241 and 242 in FIG. 3) are used. These voltage buffers 241 and 242 are constituted of several transistors. In view of this, the circuit size of the gate bias circuit 24 becomes comparatively large. Additionally, the NMOSFET 4 and PMOSFETs 5, 25, and 26 receive comparatively high input voltages. These MOSFETs each employ a MOSFET with a large element size and a high withstand voltage. Accordingly, the input protection circuit 20 has a larger circuit size. In a third embodiment described below, an input protection circuit 30 with a circuit size smaller than that of the input protection circuit 20 will be described.

Configuration of the Third Embodiment

Figure 6:
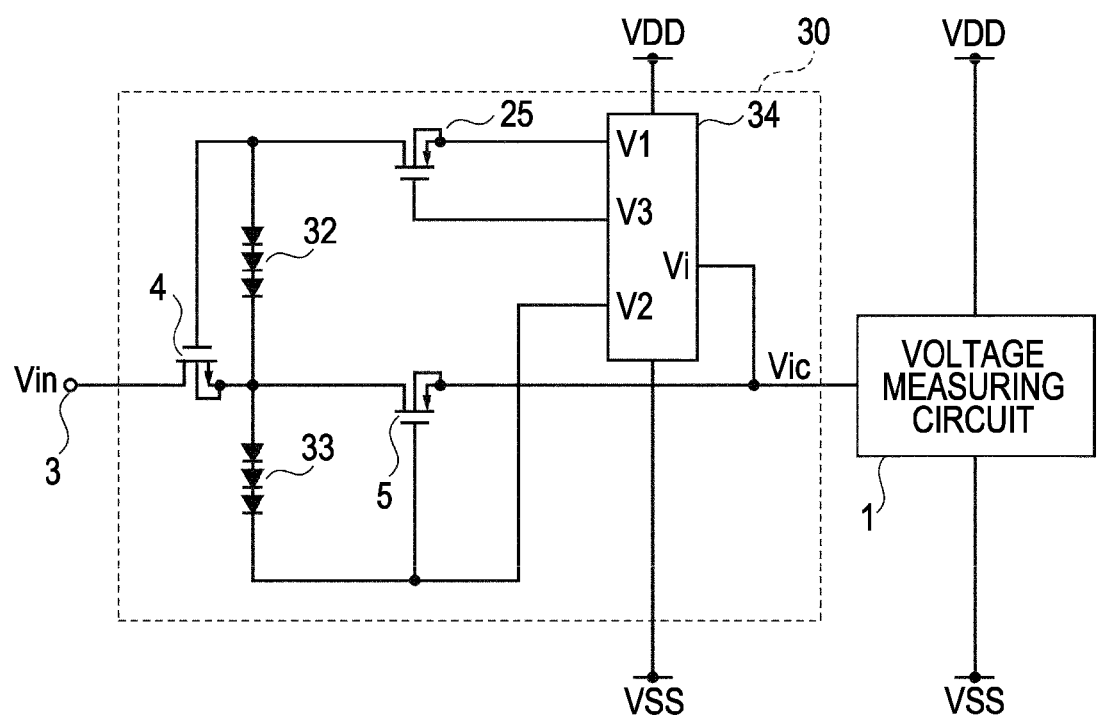
FIG. 6 is a circuit diagram illustrating a circuit configuration of a voltage measuring device that includes a voltage measuring circuit coupled to an input protection circuit according to a third embodiment.

FIG. 6 illustrates a circuit configuration of a voltage measuring device that includes a voltage measuring circuit 1 according to the third embodiment. The voltage measuring circuit 1 is coupled to the input protection circuit 30 according to the third embodiment.

A description will be given of the main differences regarding configuration between this input protection circuit 30 and the input protection circuit 20 illustrated in FIG. 2. The input protection circuit 30 includes a row of diodes 32 including a plurality of diodes coupled to one another in series in the forward direction. This row of diodes 32 corresponds to the zener diode 22 in the input protection circuit 20. The input protection circuit 30 further includes a row of diodes 33 including a plurality of diodes coupled to one another in series in the forward direction. This row of diodes 33 corresponds to the zener diode 23 in the input protection circuit 20. The input protection circuit 30 does not include any member corresponding to the PMOSFET 26 in the input protection circuit 20. The input protection circuit 30 is otherwise similar to the input protection circuit 20. Hereinafter, like names designate elements to those in FIG. 2 with similar functions, unless otherwise stated.

In the input protection circuit 30 with this circuit configuration, the gate bias circuit 34 outputs the gate bias voltage V1 of the NMOSFET 4, the gate bias voltage V2 of the PMOSFET 5, and the gate bias voltage V3 of the PMOSFET 25. On the other hand, the gate bias circuit 34 does not output the gate bias voltage V4 (the fourth voltage) of the PMOSFET 26. Hereinafter, a detailed circuit configuration of the gate bias circuit 34 will be described.

Figure 7:
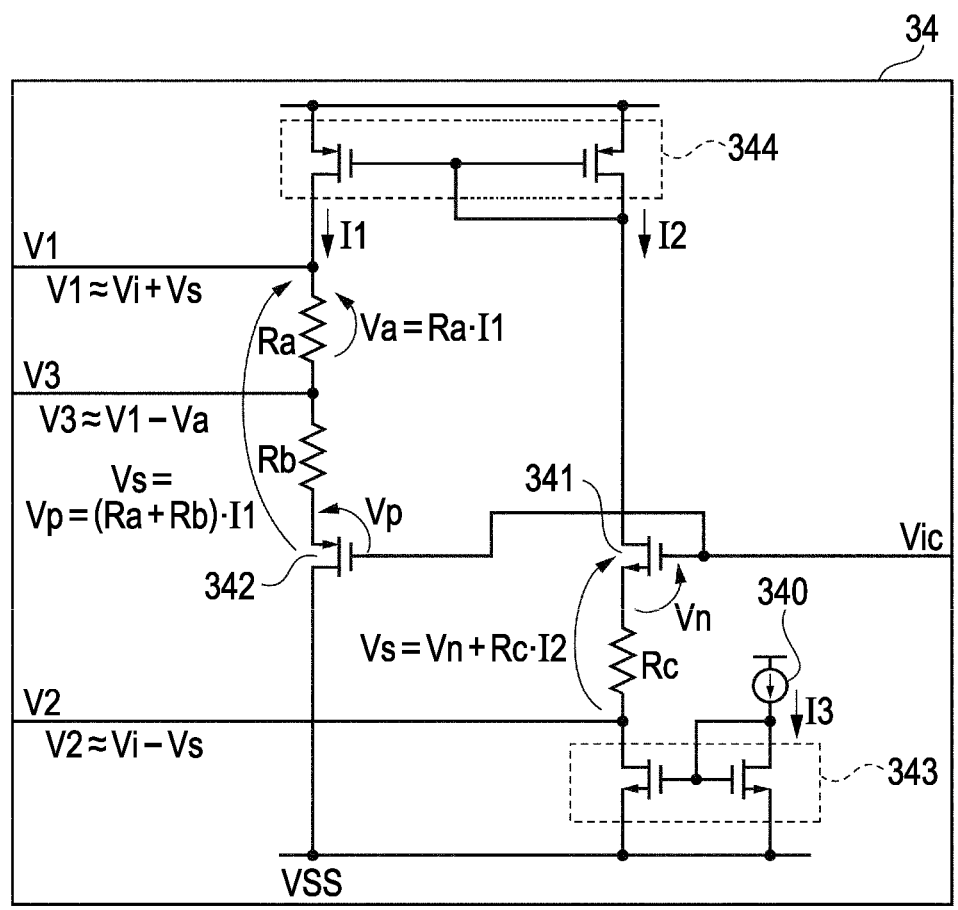
FIG. 7 is a circuit diagram illustrating a configuration of a gate bias circuit in the input protection circuit according to the third embodiment.

As illustrated in FIG. 7, the gate bias circuit 34 includes a bias current source 340, source follower circuits 341 and 342, and current mirror circuits 343 and 344. The source follower circuit 341 (a first source follower circuit) includes an NMOSFET. The source follower circuit 342 (a second source follower circuit) includes a PMOSFET. The current mirror circuit 343 (a first current mirror circuit) includes two NMOSFETs. The current mirror circuit 344 (a second current mirror circuit) includes two PMOSFETs. The current mirror circuit 343 has a MOSFET with the same polar character as that of the MOSFET of the source follower circuit 341. The current mirror circuit 344 has a MOSFET with the same polar character as that of the MOSFET of the source follower circuit 342.

The gate bias circuit 34 receives the input voltage Vic through the NMOSFET 4 and the PMOSFET 5. A level of the input voltage Vic is shifted to the positive electric potential side using the source follower circuit 342, a resistance Rb (a second resistance), and a resistance Ra (a third resistance) by the first predetermined voltage Vs. The voltage obtained by this shifting is output from the gate bias circuit 34 as the voltage V1 (the first voltage). This voltage V1 is output to the gate terminal of the NMOSFET 4 through the PMOSFET 25.

A level of the input voltage Vic is shifted to the negative electric potential side using the source follower circuit 341 and a resistance Rc (a first resistance) by the first predetermined voltage Vs. The voltage obtained by this shifting is output from the gate bias circuit 34 as the voltage V2 (a second voltage). This voltage V2 is output to the gate terminal of the PMOSFET 5.

A level of the input voltage Vic is shifted to the positive electric potential side using the source follower circuit 342 and the resistance Rb by a third predetermined voltage Va. The voltage obtained by this shifting is output from the gate bias circuit 34 as the voltage V3 (a third voltage). This voltage V3 is output to the gate terminal of the PMOSFET 25. The first predetermined voltage Vs and the third predetermined voltage Va are lower than the positive power supply voltage VDD and higher than the negative power supply voltage VSS in the voltage measuring circuit 1.

The bias current source 340 is output to a current I3 (a first current). This current I3 is output to the source follower circuit 341 and the resistance Rc as a current I2 (a second current) through the current mirror circuit 343. Additionally, the current I2 is supplied to the resistances Ra and Rb and the source follower circuit 342 as a current I1 (a third current) through the current mirror circuit 344.

The gate bias circuit 34 sets the gate-source voltages of the NMOSFET 4 and the PMOSFET 5 to the constant value Vs by tracking the input voltage Vic (that is, based on the input voltage Vin), and also generates the output voltages V1, V2, and V3 such that the gate-source voltage of the PMOSFET 25 is set to the constant value Va. However, the voltages V1 to V3 output from the gate bias circuit 34 is set not to be out of the power supply voltage range from VDD to VSS. That is, the gate bias circuit 34 is designed such that in the case where the input voltage Vin is within the voltage range from VDD−Vs to VSS+Vs, the following voltages V1 to V3 are output.

The voltage V1 is expressed by the following computation expression (1) using the gate-source voltage Vp of the source follower circuit 342 and a voltage drop by the resistance Rb, the resistance Ra, and the current I1.

$$V1 = Vic + Vp + (Ra+Rb) \cdot I1 \quad (1)$$

The voltage V2 is expressed by the following computation expression (2) using the gate-source voltage Vn of the source follower circuit 341 and a voltage drop by the resistance Rc and the current I2.

$$V2 = Vic - (Vn + Rc \cdot I2) \quad (2)$$

Here, current values of the currents I1, I2 and I3 are approximately equal to one another.

Accordingly, to satisfy Vs≈Vp+(Ra+Rb)·I1≈Vn+Rc·I2, resistance values, current values, and a similar value are adjusted. With this, the voltages V1 and V2 can be expressed by the following computation expressions (3) and (4).

$$V1 \approx Vic + Vs \quad (3)$$

$$V2 \approx Vic - Vs \quad (4)$$

The voltage V3 is expressed by the following computation expression (5) using the gate-source voltage Vp of the source follower circuit 342 and a voltage drop by the resistance Rb, and the current I1.

$$V3 = Vic + Vp + Rb \cdot I1 = Vic + Vp + (Ra+Rb) \cdot I1 - Ra \cdot I1 \quad (5)$$

Here, since Va=Ra·I1 is satisfied, V3 can be expressed by the following computation expression (6).

$$V3 \approx V1 - Va \quad (6)$$

On the other hand, in the case where the input voltage Vin becomes out of the range of the power supply voltage from VDD−Vs to VSS+Vs, for example, in the case where the input voltage Vin becomes equal to or more than VDD−Vs, the voltage value of V1 increases. In view of this, since one PMOSFET in the current mirror circuit 344 enters a linear region, the current mirror circuit 344 does not work as a current mirror. Accordingly, since I1≈0 is satisfied, V1=VDD is satisfied. In the case where the input voltage Vin is equal to or less than VSS+Vs, the voltage value of V2 decreases. In view of this, since one NMOSFET in the current mirror circuit 343 enters a linear region, the current mirror circuit 343 does not work as a current mirror. Accordingly, since I2≈0 is satisfied, V2=VSS is satisfied. If I2≈0 is satisfied, the current I1 from the current mirror circuit 344 also satisfies I1≈0. At this time, V1≈Vic+Vp, and V3≈Vic+Vp are satisfied. Accordingly, V3≈V1 is satisfied.

Here, Vs is set to values higher than threshold values of the NMOSFET 4 and the PMOSFET 5. Va is set to a value higher than a threshold value of the PMOSFET 25.

Operation of the Third Embodiment

Hereinafter, operation of the input protection circuit 30 according to the third embodiment illustrated in FIG. 6 and FIG. 7 will be described in detail.

First, a normal operation of the input protection circuit 30 will be described. The normal operation is an operation of the input protection circuit 30 in the case where the input voltage Vin is within the power supply voltage range from VDD−Vs to VSS+Vs of the voltage measuring circuit 1. In this case, the gate-source voltage of the PMOSFET 25 is maintained at the constant value Va. Accordingly, the PMOSFET 25 becomes on-state and remains at low resistance. Thus, the voltage drop at the PMOSFET 25 is small. Accordingly, the output V1 of the gate bias circuit 34 is directly applied to the gate terminal of the NMOSFET 4. Therefore, the gate-source voltage of the NMOSFET 4 is also maintained at the constant value Vs. Accordingly, the NMOSFET 4 also becomes on-state and remains at low resistance.

At this time, the gate-source voltage of the PMOSFET 5 remains at the constant value Vs. Accordingly, the PMOSFET 5 also becomes on-state and remains at low resistance. The MOSFETs 4 and 5 at low resistance allow the input voltage Vin to be input to the voltage measuring circuit 1 at low resistance. Subsequently, the voltage measuring circuit 1 measures an analog voltage with high accuracy with respect to the input voltage Vin.

Next, a protection operation at input of an excessive voltage will be described. In the case where the input voltage Vin is equal to or more than VDD−Vs, the NMOSFET 4 becomes off-state so as to be at high resistance. Accordingly, the input voltage Vin is not input to the voltage measuring circuit 1. In the case where the input voltage Vin is equal to or less than VSS+Vs, the drain-bulk parasitic diode is in the forward direction. Accordingly, the NMOSFET 4 remains at low resistance. On the other hand, the PMOSFET 5 becomes off-state so as to be at high resistance. Accordingly, the input voltage Vin is not input to the voltage measuring circuit 1. This consequently protects the voltage measuring circuit 1 against the excessive input voltage.

When the input voltage Vin becomes lower to the negative electric potential side with respect to VSS+Vs, the gate-source voltage of the NMOSFET 4 becomes higher. At this time, the row of diodes 32 clamps the gate-source voltage of the NMOSFET 4 such that the gate-source voltage of the NMOSFET 4 does not exceed the withstand voltage. In the case where the input voltage Vin becomes equal to or less than VSS+Vs, the PMOSFET 25 becomes, similarly to the PMOSFET 5, off-state so as to be at high resistance. Accordingly, even if the row of diodes 32 performs clamping, the PMOSFET 25 restricts the output current of the gate bias circuit 34. This protects the gate bias circuit 34 such that the excessive current does not flow.

In the case where the input voltage Vin is equal to or less than VSS+Vs, the gate-drain voltage of the PMOSFET 5 is divided by the row of diodes 33. The number of diodes in the forward direction in the row of diodes 33 is set such that the gate-source voltage of the PMOSFET 5 does not exceed the withstand voltage. Accordingly, the PMOSFET 26 in the input protection circuit 20 is not necessary for the input protection circuit 30. Thus, the input protection circuit 30 protects the voltage measuring circuit 1 against the excessive input voltage. Additionally, this maintains high resistance with respect to the excessive input voltage.

The row of diodes 33 cancels leak current that flows into the row of diodes 32. This function is otherwise similar to the input protection circuit 20. At the normal operation, the leak current that flows into the row of diodes 32 flows into the row of diodes 33. This reduces input leak current viewed from the input terminal 3 side.

Advantageous effect of the Third Embodiment

As described above, the input protection circuit 30 according to the third embodiment is disposed between the input terminal 3 to which the input voltage Vin is applied and the voltage measuring circuit 1. The voltage measuring circuit 1 receives the positive power supply voltage VDD and the negative power supply voltage VSS. The input protection circuit 30 includes the MOSFETs 4 and 5 that have polar characters different from each other and coupled in series. These MOSFETs 4 and 5 are inserted between the input terminal 3 and the voltage measuring circuit 1. In the case where the input voltage Vin becomes out of the power supply voltage range of the voltage measuring circuit 1, one of the MOSFETs becomes off-state at high resistance. This prevents an excessive voltage from being input to the voltage measuring circuit 1.

The input protection circuit 30 further includes the PMOSFET 25, the row of diodes 32 and 33, and the gate bias circuit 34. The drain terminal of the PMOSFET 25 is coupled to the gate terminal of the NMOSFET 4. The row of diodes 32 is coupled between the gate and the source of the NMOSFET 4. The row of diodes 33 is coupled between the gate and the drain of the PMOSFET 5. The gate bias circuit 34 generates the gate-source voltage of the NMOSFET 4, the PMOSFET 5, and the PMOSFET 25 by tracking the input voltage Vin (that is, based on the input voltage Vin) such that the gate-source voltages of the MOSFETs 4 and 5 become constant and the gate-source voltage of the PMOSFET 25 also becomes constant. In the case where the input voltage Vin becomes out of the power supply voltage range from VDD−Vs to VSS+Vs of the voltage measuring circuit 1, the gate bias circuit 34 generates the gate-source voltages V1, V2, and V3 to make the PMOSFET 25 off-state (at high resistance).

In the input protection circuit 30, in the case where the input voltage Vin becomes out of the power supply voltage from VDD−Vs to VSS+Vs (in the case of the excessive input voltage Vin), the PMOSFET 25 for limiting current becomes off-state (at high resistance). In this case, respective MOSFETs 4 and 5 interposed into a path of the input voltage Vin to the voltage measuring circuit 1 also become at high resistance. This restricts the excessive input voltage Vin input into the voltage measuring circuit 1. This protects the voltage measuring circuit 1.

Accordingly, when the excessive input voltage Vin is input, the PMOSFET 25 becomes at high resistance. In the input protection circuit 30, with this effect, the row of diodes 33 is coupled between the gate and the drain of the PMOSFET 5 for limiting current. The leak current that flows into the row of diodes 32 flows into the row of diodes 33, thus reducing input leak current viewed from the input terminal 3 side.

In the input protection circuit 30, the gate bias circuit 34 generates the gate-source voltages of the MOSFETs 4, 5, and 25 by tracking the input voltage Vin (that is, based on the input voltage Vin) such that the gate-source voltages of the NMOSFET 4 and the PMOSFET 5 become constant and the gate-source voltage of the PMOSFET 25 for limiting current also becomes constant. This gate bias circuit 34 includes the bias current source 340, the source follower circuits 341 and 342, and the current mirror circuits 343 and 344. The current mirror circuit 343 is coupled to the source follower circuit 341 through the resistance Rc. The current mirror circuit 343 inputs the current I3 supplied from the bias current source 340. The current mirror circuit 343 outputs the current I2 to the source follower circuit 341 and the resistance Rc. The current mirror circuit 344 is coupled to the source follower circuit 342 through the series circuit including the resistances Ra and Rb. The current mirror circuit 344 receives the current I2. The current mirror circuit 344 outputs the current I1 to the source follower circuit 342 and the resistances Ra and the resistance Rb.

In the input protection circuit 30, the input voltage Vic is output to the voltage measuring circuit 1 through the NMOSFET 4 and PMOSFET 5 coupled in series. From the input voltage Vic, the voltage V1 is generated and output to the gate terminal of the NMOSFET 4 through the PMOSFET 25. This voltage V1 is a voltage where the input voltage Vic is level-shifted to the positive electric potential side by the constant value. This constant value is determined by the gate-source voltage Vp of the source follower circuit 342 and the voltage drop by the resistance Ra and Rb and the current I1 (V1=Vic+Vp+(Ra+Rb)·I1). Additionally, this voltage V1 is a value within the power supply voltage range (VDD−Vs to VSS+Vs) of the voltage measuring circuit 1.

The voltage V2 is generated from the input voltage Vic and output to the gate terminal of the PMOSFET 5. This voltage V2 is a voltage where the input voltage Vic is level-shifted to the negative electric potential side by the constant value. This constant value is determined by the gate-source voltage Vn of the source follower circuit 341 and the voltage drop by the resistance Rc and the current I2 (V2=Vic−(Vn+Rc·I2)). Additionally, this voltage V2 is a value within the power supply voltage range.

Additionally, the voltage V3 is generated from the input voltage Vic and output to the gate terminal of the PMOSFET 25. This voltage V3 is a voltage where the input voltage Vic is level-shifted to the positive electric potential side by the constant value. This constant value is determined by the gate-source voltage Vp of the source follower circuit 342 and the voltage drop by the resistance Rb and the current I1 (V3=Vic+Vp+Rb·I1=Vic+Vp+(Ra+Rb)·I1−Ra·I1). Additionally, this voltage V3 is a value within the power supply voltage range.

In this input protection circuit 30, the gate bias circuit 34 is achieved with the small number of elements. That is, the gate bias circuit 34 is achieved by two MOSFETs included in the source follower circuit 341 and 342, four MOSFETs included in the current mirror circuits 343 and 344, and three resistances (Ra, Rb, and Rc). Compared with the input protection circuit 20, this eliminates one MOSFET that has a large element size and a high withstand voltage. Accordingly, the input protection circuit 30 is an input protection circuit with a small circuit size.

The preferred embodiment of this disclosure has been described in detail above. The technical scope of this disclosure is not limited to the scope described in the above-described embodiments. Possible various changes and modifications to the above-described embodiments are apparent to those skilled in the art. Additionally, it is also apparent that these embodiments with the changes and modifications may be within the technical scope of this disclosure from the description of prediction of claims.

One object of this disclosure is to provide an input protection circuit that provides a protection between a gate and a source of a field effect transistor that protects an internal circuit against an excessive input voltage and reduces leak current that flows between the gate and the source through the diode so as not to adversely affect the internal circuit.

In the configuration illustrated in FIG. 1, the voltage shift circuit 11 may provide the gate potential of the respective MOSFETs 4 and 5 by tracking Vic, which is the input voltage Vin, and may hold the gate-source voltage of the respective MOSFETs 4 and 5 at a voltage value that is constant and less than the power supply voltage range (VDD to VSS).

The input protection circuit 20 according to the second embodiment may include at least two MOSFETs 4 and 5 coupled in series between the input terminal 3 to which the input voltage Vin is applied and the voltage measuring circuit 1 to which the voltage applied to the input terminal 3 is input, and may turn off one of the transistors when the input voltage Vin exceeds the power supply voltage of the voltage measuring circuit 1 to prevent excessive voltage input to the voltage measuring circuit 1.

The voltage buffer 242 may be constituted such that one of the two input sides is coupled to the output terminal of the voltage buffer 241, the other input side is coupled to the output terminal of the level-shift circuit 245, one of the two output sides may be coupled to the output terminal of the level-shift circuit 244, and the other output side may be coupled to the output terminal of the voltage V3. This voltage buffer 242 shifts, at the input side, the output voltage V2 of the level-shift circuit 245 by the electric potential Va as the output voltage Vo of the voltage buffer 241, thus performing an operation where the output voltage V3 at the output side is shifted by the electric potential Vb (here, Vb≈Va) as the output voltage V1.

The input protection circuit 20 may be constituted as follows. The input protection circuit 20 includes the PMOSFET 25, the PMOSFET 26, the zener diode 22, the zener diode 23, and the gate bias circuit 24. The PMOSFET 25 has the drain terminal coupled to the gate terminal of the NMOSFET 4 at the input terminal 3 side. The PMOSFET 26 has the drain terminal coupled between the respective MOSFETs 4 and 5 and the source terminal coupled to the gate terminal of the PMOSFET 5. The zener diode 22 is coupled between the gate and the source the NMOSFET 4. The zener diode 23 is coupled between the gate and the drain the PMOSFET 26. The gate bias circuit 24 generates the voltage tracked at the input voltage Vin between the gate and the source of the PMOSFETs 25 and 26 such that the gate-source voltages of the respective MOSFETs 4 and 5 become constant and the gate-source voltages of the respective PMOSFETs 25 and 26 also become constant. The gate bias circuit 24 may be configured to generate the gate-source voltages V1 and V3 and the gate-source voltages V2 and V4 to turn off the PMOSFETs 25 and 26 when the input voltage Vin exceeds the power supply voltage range VDD−Vs to VSS+2Vs of the voltage measuring circuit 1.

The output voltages V1, V2, and V3 of the gate bias circuit 34 causes voltages following the input voltage Vic such that the gate-source voltages of the NMOSFET 4 and the PMOSFET 5 become constant at Vs and the gate-source voltage of the PMOSFET 25 becomes constant at Va. Here, the respective voltages V1 to V3 output from the gate bias circuit 34 cannot exceed the power supply voltage from VDD to VSS. That is, the gate bias circuit 34 is designed such that the following voltages are output when the input voltage Vin is within the range of VDD−Vs to VSS+Vs.

The input protection circuit 30 may include the PMOSFET 25, the diode 32 in the forward direction, the diode 33 in the forward direction, and the gate bias circuit 34. The PMOSFET 25 has the drain terminal coupled to the gate terminal of the NMOSFET 4 at the input terminal 3 side. The diode 32 is coupled between the gate and the source the NMOSFET 4. The diode 33 is coupled between the gate and the drain the PMOSFET 5. The gate bias circuit 34 generates voltages following the input voltage Vin between the respective gates and sources of the NMOSFET 4, the PMOSFET 5, and the PMOSFET 25 such that the respective gate-source voltages of the MOSFETs 4 and 5 become constant and the gate-source voltage of the PMOSFET 25 also become constant. Additionally, the gate bias circuit 34 may have the configuration that generates the gate-source voltages V1, V2, and V3 to turn off the PMOSFET 25 at high resistance when the input voltage Vin exceeds the power supply voltage range from VDD−Vs to VSS+Vs of the voltage measuring circuit 1.

The input protection circuit 30 may be constituted as follows so that the respective gate-source voltages of the NMOSFET 4 and the PMOSFET 5 become constant and the gate-source voltage of the PMOSFET 25 for limiting current becomes constant. The gate bias circuit 34 that generates voltages following the input voltage Vin between the respective gates and sources of the MOSFETs 4, 5, and 25 may include the source follower circuits 341 and 342, the current mirror circuit 343, and the current mirror circuit 344. The current mirror circuit 343 is coupled to the source follower circuit 341 through the resistance Rc, uses the current I3 supplied from the bias current source 340 as input, and outputs the current I2 to the source follower circuit 341 and the resistance Rc. The current mirror circuit 344 is coupled to the source follower circuit 342 through the series circuit that includes the resistances Ra and Rb, uses the current I2 as input, and outputs the current I1 to the source follower circuit 342, and the resistances Ra and Rb.

Additionally, the following configuration may be employed. The input voltage Vic output to the voltage measuring circuit 1 through the NMOSFET 4 and the PMOSFET 5 coupled in series is level-shifted using the gate-source voltage Vp of the source follower circuit 342 and the voltage drop by the resistances Ra and Rb and the current I1 to the positive electric potential side by the voltage less than the power supply voltage range (VDD−Vs to VSS+Vs) of the voltage measuring circuit 1 at a constant rate (V1=Vic+Vp+(Ra+Rb)·I1). This voltage is output to the gate terminal of the NMOSFET 4 through the PMOSFET 25. Additionally, the input voltage Vic is level-shifted using the gate-source voltage Vn of the source follower circuit 341 and the voltage drop by the resistance Rc and the current I2 to the negative electric potential side by the voltage less than the power supply voltage range at a constant rate (V2=Vic−(Vn+Rc·I2)). This voltage is output to the gate terminal of the PMOSFET 5. Additionally, the input voltage Vic is level-shifted using the gate-source voltage Vp of the source follower circuit 342 and the voltage drop by the resistance Rb and the current I1 to the positive electric potential side by the voltage less than the power supply voltage range at a constant rate (V3=Vic+Vp+Rb·I1=Vic+Vp+(Ra+Rb)·I1−Ra·I1). This voltage is output to the gate terminal of the PMOSFET 25.

The input protection circuit according to this disclosure may be first to fourteenth input protection circuits as follows. A first input protection circuit includes at least two field-effect type transistors coupled in series between an input terminal that receives an input voltage and an electronic circuit that receives an applied voltage to the input terminal, and prevents an excessive voltage input to the electronic circuit by turning off one of the transistors when the input voltage exceeds a power supply voltage of the electronic circuit. This input protection circuit includes diodes and a voltage shift circuit. The diodes are coupled between respective gates and sources of the transistors coupled in series. The voltage shift circuit provides gate potentials of the respective transistors by tracking the input voltage to hold the gate-source voltages of the respective transistors constant and a voltage value less than the power supply voltage.

With this configuration, in the case where the diode is a zener diode as described below, the reverse-bias voltage of the zener diode becomes a gate-source voltage of each transistor. This voltage becomes a voltage less than the power supply voltage. Accordingly, the reverse-bias voltage decreases compared with a case where the gate terminal of the transistor receives the power supply voltage like the known technique. This reduces leak current flowing into the zener diode. Thus, this prevents occurrence of the following situation. Like the known technique, an exponential increase in leak current in association with increase in input voltage adversely affects an electronic circuit such as a circuit that measures an analog voltage with high accuracy. Additionally, the zener diode provides protection between the gate and the source of the transistor.

A second input protection circuit includes at least two field-effect type transistors of a first transistor and a second transistor that are coupled in series between an input terminal that receives an input voltage and an electronic circuit that receives an applied voltage to the input terminal, and prevents an excessive voltage input to the electronic circuit by turning off one of the transistors when the input voltage exceeds a power supply voltage of the electronic circuit. This input protection circuit includes a third transistor, a fourth transistor, a first diode, a second diode, and a gate bias circuit. The third transistor has a drain terminal coupled to a gate terminal of the first transistor at the input terminal side. The fourth transistor has a drain terminal coupled between the first transistor and the second transistor and the source terminal coupled to a gate terminal of the second transistor. The first diode is coupled between the gate and a source of the first transistor. The second diode is coupled between the gate and the drain of the fourth transistor. The gate bias circuit generates a voltage tracked at the input voltage between the respective gates and sources of the third transistor and the fourth transistor such that gate-source voltages of the first transistor and the second transistor become constant and gate-source voltages of the third transistor and the fourth transistor become constant. The gate bias circuit generates gate-source voltages to turn off the third transistor and the fourth transistor when the input voltage exceeds a power supply voltage range of the electronic circuit.

In a third input protection circuit according to the first and second input protection circuits, the first diode and the second diode are zener diodes.

With these configurations, in the case where the first diode and the second diode are zener diodes, the third and fourth transistors for limiting current become at high resistance only in the case of an excessive input where the input voltage exceeds the power supply voltage. This restricts the excessive input voltage by making the first and second transistors, which are interposed into a path for inputting the input voltage to the electronic circuit, at high resistance. This protects the electronic circuit.

Additionally, with the configuration that makes the third and fourth transistors at high resistance only in the case of the excessive input, the second zener diode is allowed to be coupled between the gate and the drain of the fourth transistor for limiting current. In a typical configuration, the second zener diode is coupled between the gate and the source of the second transistor. Accordingly, the circuit configuration where the second zener diode is coupled between the gate and the drain of the fourth transistor makes reverse-bias voltages of the first and second zener diodes equal to each other at a normal operation compared with the above-described general circuit configuration where the second zener diode is coupled between the gate and the source of the second transistor. Accordingly, making the reverse-bias voltages equal to each other as much as possible reduces input leak current generated due to unbalanced leak currents at the first and second zener diodes.

In the first and second input protection circuits, a fourth input protection circuit includes the first and second diodes that are PN junction diodes each coupled in a reverse direction between the gate and the source or between the gate and the drain.

In the first and second input protection circuits, a fifth input protection circuit includes the first and second diodes that are a plurality of PN junction diodes. The plurality of PN junction diodes are coupled in a forward direction between the gate and the source or between the gate and the drain.

These configurations each provide an advantage where the first and second diodes are easily formed as an IC in the case where the first and second diodes are normal PN junction diodes compared with special zener diodes.

A sixth input protection circuit includes first and second transistors that have polar characters different from each other and are coupled in series. The first and second transistors are inserted between an input terminal that receives an input voltage and an electronic circuit that receives a positive power supply voltage and a negative power supply voltage. The first transistor has a gate terminal that receives the positive power supply voltage while the second transistor has a gate terminal that receives the negative power supply voltage. In the case where the input voltage becomes larger than the positive power supply voltage to the positive electric potential side or becomes larger than the negative power supply voltage to the negative electric potential side so as to exceed a power supply voltage range of the electronic circuit, the input protection circuit holds the first transistor or the second transistor at high resistance to prevent an excessive voltage input to the electronic circuit. This input protection circuit includes first and second diodes and a gate bias circuit. The first and second diodes are coupled between respective gates and sources of the first and second transistors. The gate bias circuit provides gate potentials to the first and second transistors following the input voltage to hold the gate-source voltages of the first and second transistors constant and voltage values less than the power supply voltage range of the electronic circuit.

In the sixth input protection circuit, a seventh input protection circuit includes the gate bias circuit that includes a voltage buffer, a first level-shift circuit, and a second level-shift circuit. The voltage buffer monitors a voltage output to the electronic circuit through the first and second transistors to output a first voltage. The first level-shift circuit shifts the first voltage to the positive electric potential side as a second voltage by a voltage that is smaller than the positive power supply voltage and corresponds to a reverse-bias voltage of the first diode, and outputs the second voltage to the gate terminal of the first transistor. The second level-shift circuit shifts the first voltage to the negative electric potential side as a third voltage by a constant voltage that is higher than the negative power supply voltage and corresponds to a reverse-bias voltage of the second diode, and outputs the third voltage to the gate terminal of the second transistor.

In the case where the first and second diodes are constituted of, for example, zener diodes, reverse-bias voltages of the zener diodes are used as gate-source voltages of the respective transistors. These voltages become less than the power supply voltage. This reduces the reverse-bias voltage compared with the case where the power supply voltage is applied to the gate terminal of the transistor like the known technique. This reduces leak current that flows through the zener diode. Therefore, this avoid known inconvenience such as an exponential increase in leak current in association with increase in input voltage and a negative effect, for example, on an electronic circuit such as a voltage measuring circuit that measures the analog voltage with high accuracy due to this increase. Additionally, the zener diode protects a gate-source withstand voltage of the field-effect type transistor.

An eighth input protection circuit includes first and second transistors that have polar characters different from each other and are coupled in series. The first and second transistors are inserted between an input terminal that receives an input voltage and an electronic circuit that receives a positive power supply voltage and a negative power supply voltage. The first transistor has a gate terminal that receives the positive power supply voltage while the second transistor has a gate terminal that receives the negative power supply voltage. In the case where the input voltage becomes larger than the positive power supply voltage to a positive electric potential side or becomes larger than the negative power supply voltage to a negative electric potential side so as to exceed a power supply voltage range of the electronic circuit, the input protection circuit holds the first transistor or the second transistor at high resistance to prevent an excessive voltage input to the electronic circuit. This input protection circuit includes a third transistor, a fourth transistor, a first diode, a second diode, and a gate bias circuit. The third transistor has a drain terminal coupled to the gate terminal of the first transistor and the same polar character as that of the second transistor. The fourth transistor has a drain terminal coupled between the first transistor and the second transistor, a source terminal coupled to the gate terminal of the second transistor, and the same polar character as that of the second transistor. The first diode is coupled between the gate and the source of the first transistor. The second diode is coupled between the gate and the drain of the second transistor through the fourth transistor. The gate bias circuit generates voltages following the input voltage between respective gates and sources of the first, second, third, fourth transistors such that gate-source voltages of the first transistor and the second transistor become constant and gate-source voltages of the third transistor and the fourth transistor become constant. The gate bias circuit generates the gate-source voltages to hold the third transistor and the fourth transistor at high resistance in the case where the input voltage exceeds the power supply voltage range of the electronic circuit.

In the eighth input protection circuit, a ninth input protection circuit includes the gate bias circuit that includes a first voltage buffer, a first level-shift circuit, a second level-shift circuit, a third level-shift circuit, a fourth level-shift circuit, and a second voltage buffer. The first voltage buffer monitors a voltage output to the electronic circuit through the first and second transistors so as to generate an input voltage. The first level-shift circuit shifts the input voltage to the positive electric potential side as a first voltage by a voltage that is lower than the positive power supply voltage and corresponds to the reverse-bias voltage of the first diode, and outputs the first voltage to the gate terminal of the first transistor through the third transistor. The second level-shift circuit shifts the input voltage to the negative electric potential side as a second voltage by a voltage that is higher than the negative power supply voltage and corresponds to the reverse-bias voltage of the second diode, and outputs the second voltage to the gate terminal of the second transistor. The third and fourth level-shift circuits each shift the input voltage to the negative electric potential side as a fourth voltage by a voltage that is higher than the negative power supply voltage and correspond to the reverse-bias voltage of the second diode, and output the fourth voltage to the gate terminal of the fourth transistor. The second voltage buffer monitors a potential difference between the input voltage and the second voltage to generate a predetermined potential difference between the first voltage and the third voltage so as to output the predetermined potential difference to the gate terminal of the third transistor.

In a tenth input protection circuit according to the sixth or eighth input protection circuit, the first and second diodes that are zener diodes.

In the case where the first and second diodes are constituted of, for example, zener diodes, the third and fourth transistors for limiting current become at high resistance only in the case of the excessive input where the input voltage exceeds the power supply voltage. Accordingly, this restricts the excessive input voltage with the first and second transistors, which is inserted into a path where the input voltage is input to the electronic circuit, at high resistance. Thus, this protects the electronic circuit. Additionally, the third and fourth transistors become at high resistance only in the case of the excessive voltage input. This configuration allows coupling the second diode (zener diode) between the gate and the drain of the second transistor for limiting current through the fourth transistor. In a typical configuration, the second diode (zener diode) is coupled between the gate and the source of the second transistor. Accordingly, the circuit configuration where the second diode (zener diode) is coupled between the gate and the drain of the second transistor through the fourth transistor makes reverse-bias voltages of the first and second diodes (zener diodes) equal to each other at a normal operation compared with the general circuit configuration where the second diode (zener diode) is coupled between the gate and the source of the second transistor. Accordingly, making the reverse-bias voltages equal to each other as much as possible reduces input leak current generated due to unbalanced leak currents at the first and second diodes (zener diodes).

In the eighth input protection circuit, an eleventh input protection circuit includes the first and second diodes that are PN junction diodes each coupled in a reverse direction between the gate and the source of the first transistor or between the gate and the drain of the second transistor through the fourth transistor.

In the eighth input protection circuit, a twelfth input protection circuit includes the first and second diodes that are a plurality of PN junction diodes. The plurality of PN junction diodes are coupled in a forward direction between the gate and the source of the first transistor or between the gate and the drain of the second transistor through the fourth transistor.

These configurations each provide an advantageous effect where the first and second diodes are easily formed as an IC in the case where the first and second diodes are normal PN junction diodes compared with special zener diodes.

A thirteenth input protection circuit includes first and second transistors that have polar characters different from each other and are coupled in series. The first and second transistors are inserted between an input terminal that receives an input voltage and an electronic circuit that receives a positive power supply voltage and a negative power supply voltage. The first transistor has a gate terminal that receives the positive power supply voltage while the second transistor has a gate terminal that receives the negative power supply voltage. In the case where the input voltage becomes larger than the positive power supply voltage to the positive electric potential side or becomes larger than the negative power supply voltage to the negative electric potential side so as to exceed a power supply voltage range of the electronic circuit, the input protection circuit holds the first transistor or the second transistor at high resistance to prevent an excessive voltage input to the electronic circuit. This input protection circuit includes a third transistor, first diode in a forward direction, a second diode in a forward direction, and a gate bias circuit. The third transistor has a drain terminal coupled to the gate terminal of the first transistor and the same polar character as that of the second transistor. The first diode in a forward direction is coupled between the gate and the source of the first transistor. The second diode in a forward direction is coupled between the gate and the drain of the second transistor. The gate bias circuit generates voltages following the input voltage between respective gates and sources of the first, second, and third transistors such that the gate-source voltages of the first and second transistors become constant and the gate-source voltage of the third transistor becomes constant. The gate bias circuit generates the gate-source voltages that hold the first transistor at high resistance or hold the second and third transistors at high resistance in the case where the input voltage exceeds the power supply voltage range of the electronic circuit.

In the thirteenth input protection circuit, a fourteenth input protection circuit includes the gate bias circuit that includes a first source follower circuit, a second source follower circuit, a first current mirror circuit, and a second current mirror circuit. The first and second source follower circuits include transistors with different polar characters. The first current mirror circuit is coupled to the first source follower circuit through a first resistance, receives a first current supplied from a bias current source as input, and outputs a third current to the first source follower circuit and the first resistance. The first current mirror circuit includes a transistor with the same polar character as that of the first source follower circuit. The second current mirror circuit is coupled to the second source follower circuit through a series circuit formed of a second resistance and a third resistance, receives the second current as input, and outputs a third current to the second source follower circuit, the second resistance, and the third resistance. The second current mirror circuit includes a transistor with the same polar character as that of the second source follower circuit. The gate bias circuit shifts a voltage output to the electronic circuit through the first and second transistors using a gate-source voltage of the second source follower circuit and a voltage drop by the second and third resistances and the third current. This voltage is shifted to a positive electric potential side by a voltage that is smaller than the positive power supply voltage and corresponds to a reverse-bias voltage of the first diode in the forward direction as a first voltage. The first voltage is output to the gate terminal of the first transistor through the third transistor. The gate bias circuit shifts a voltage output to the electronic circuit through the first and second transistors using a gate-source voltage of the first source follower circuit and a voltage drop by the first resistance and the second current. This voltage is shifted to a negative electric potential side by a voltage that is higher than the negative power supply voltage and corresponds to a reverse-bias voltage of the second diode in the forward direction as a second voltage. The second voltage is output to the gate terminal of the second transistor. The gate bias circuit shifts a voltage output to the electronic circuit through the first and second transistors using the gate-source voltage of the second source follower circuit and a voltage drop by the second resistance and the third current. This voltage is shifted to the positive electric potential side by a voltage that is smaller than the positive power supply voltage and corresponds to the reverse-bias voltage of the first diode in the forward direction as a third voltage. The third voltage is output to the gate terminal of the third transistor.

With this configuration, the third transistor for limiting current becomes at high resistance only when the input voltage exceeds the power supply voltage range, that is, in the case of excessive input. Thus, this holds the first and second transistors, which are inserted into a path for inputting the input voltage to the electronic circuit, at high resistance, and restricts an excessive input voltage to protect the electronic circuit. Additionally, only in the case of the excessive voltage input, the third transistor becomes at high resistance. This configuration allows coupling the second diode in the forward direction between the gate and the drain of the second transistor, and makes leak current that flows into the first diode in the forward direction flow into the second diode in the forward direction so as to reduce input leak current viewed from the input terminal side.

Additionally, this configuration ensures the gate bias circuit that generates the voltages following the input voltage between the respective gates and sources of the first, second, and third transistors such that the gate-source voltages of the first and second transistors become constant and the gate-source voltage of the third transistor becomes constant. The gate bias circuit is achieved with the small number of components including field-effect type transistor elements and resistance elements that constitute the first and second source follower circuits and the first and second current mirror circuits. Additionally, this reduces the number of field-effect type transistor elements with large element sizes and high withstand voltages and ensures a gate bias function, thus providing an input protection circuit with small circuit size.

The first to fourteenth input protection circuits each provide an input protection circuit that provides a protection between the gate and the source of the MOSFET to protect an internal circuit against the excessive input voltage and reduces leak current that flows between the gate and the source through the diode so as not to adversely affect the internal circuit.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. An input protection circuit comprising:
   a first transistor of a field-effect type coupled in series between an input terminal and an electronic circuit, the input terminal receiving an input voltage, the electronic circuit receiving an input voltage, the first transistor switching to an off-state in a case where the input voltage is higher than a positive power supply voltage of the electronic circuit;
   a second transistor of a field-effect type coupled in series between the first transistor and the electronic circuit, the second transistor switching to an off-state in a case where the input voltage is lower than the negative power supply voltage of the electronic circuit;

a voltage control circuit configured to maintain gate-source voltages of the first transistor and the second transistor as voltages within a power supply voltage range of the electronic circuit based on the input voltage;

a first diode coupled between a gate and a source of the first transistor; and a second diode coupled between a gate and a source of the second transistor, wherein, the first transistor is an N-type field-effect transistor, the first transistor having a drain coupled to the input terminal, the first transistor has a source coupled to a drain of the second transistor, the second transistor is a P-type field-effect transistor, the second transistor having a source coupled to the electronic circuit and the voltage control circuit includes:
- a first voltage buffer for monitoring the input voltage;
- a first level-shift circuit configured to output a sum of the input voltage and a predetermined voltage to the gate of the first transistor; and
- a second level-shift circuit configured to input a difference between the input voltage and a predetermined voltage to the gate of the second transistor, wherein the predetermined voltage is lower than the positive power supply voltage of the electronic circuit and higher than the negative power supply voltage of the electronic circuit.

2. The input protection circuit according to claim 1, wherein
the first diode and the second diode are zener diodes.

3. The input protection circuit according to claim 1, wherein
the first diode and the second diode are PN junction diodes each coupled in a reverse direction between a gate and a source or between a gate and a drain of a corresponding transistor.

4. An input protection circuit comprising:
a first transistor of a field-effect type coupled in series between an input terminal and an electronic circuit, the input terminal receiving an input voltage, the electronic circuit receiving an input voltage, the first transistor switching to an off-state in a case where the input voltage is higher than a positive power supply voltage of the electronic circuit;

a second transistor of a field-effect type coupled in series between the first transistor and the electronic circuit, the second transistor switching to an off-state in a case where the input voltage is lower than the negative power supply voltage of the electronic circuit;

a voltage control circuit configured to maintain gate-source voltages of the first transistor and the second transistor as voltages within a power supply voltage range of the electronic circuit based on the input voltage;

a first diode coupled between a gate and a source of the first transistor; and a second diode coupled between a gate and a source of the second transistor wherein, the first transistor is an N-type field-effect transistor, the first transistor having a drain coupled to the input terminal, the first transistor has a source coupled to a drain of the second transistor, the second transistor is a P-type field-effect transistor, the second transistor having a source coupled to the electronic circuit, and the first diode and the second diode are a row of diodes that includes a plurality of PN junction diodes, the PN junction diodes being each coupled in a forward direction between a gate and a source or between a gate and a drain of a corresponding transistor.

5. An input protection circuit comprising:
a first transistor of a field-effect type coupled in series between an input terminal and an electronic circuit, the input terminal receiving an input voltage, the electronic circuit receiving an input voltage, the first transistor switching to an off-state in a case where the input voltage is higher than a positive power supply voltage of the electronic circuit;

a second transistor of a field-effect type coupled in series between the first transistor and the electronic circuit, the second transistor switching to an off-state in a case where the input voltage is lower than the negative power supply voltage of the electronic circuit;

a voltage control circuit configured to maintain gate-source voltages of the first transistor and the second transistor as voltages within a power supply voltage range of the electronic circuit based on the input voltage;

a third transistor of a P-type field-effect transistor having a drain and a source, the drain being coupled to a coupling line for the first transistor and the second transistor, the source being coupled to the gate of the second transistor;

a fourth transistor of a P-type field-effect transistor having a drain coupled to the gate of the first transistor;

a first diode coupled between the gate and the source of the first transistor; and a third diode coupled between the gate and the drain of the third transistor, wherein the voltage control circuit switches the third transistor and the fourth transistor to an off-state in a case where the input voltage is lower than the negative power supply voltage of the electronic circuit, wherein the first transistor is an N-type field-effect transistor, the first transistor having a drain coupled to the input terminal, the first transistor has a source coupled to a drain of the second transistor, and the second transistor is a P-type field-effect transistor, the second transistor having a source coupled to the electronic circuit.

6. The input protection circuit according to claim 5, wherein
the voltage control circuit includes:
- a first voltage buffer for monitoring the input voltage;
- a first level-shift circuit configured to generate a sum of the input voltage and the first predetermined voltage to output the sum to a source of the fourth transistor;
- a second voltage buffer configured to generate a difference between a voltage generated by the first level-shift circuit and a second predetermined voltage to output the difference to the fourth transistor;
- a second level-shift circuit configured to generate a difference between the input voltage and the first predetermined voltage to output the difference to the source of the third transistor;
- a third level-shift circuit configured to generate a difference between the input voltage and the first predetermined voltage; and
- a fourth level-shift circuit configured to generate a difference between a voltage output from the third level-shift circuit and the first predetermined voltage to output the difference to the gate of the third transistor, wherein the first predetermined voltage and the second predetermined voltage are lower than the positive power supply voltage of the electronic circuit and higher than the negative power supply voltage of the electronic circuit.

7. The input protection circuit according to claim 5, wherein
the first diode and the third diode are zener diodes.

8. The input protection circuit according to claim 5, wherein
the first diode and the third diode are PN junction diodes each coupled in a reverse direction between a gate and a source or between a gate and a drain of a corresponding transistor.

9. The input protection circuit according to claim 5, wherein
the first diode and the third diode are a row of diodes that includes a plurality of PN junction diodes, the PN junction diodes being each coupled in a forward direction between a gate and a source or between a gate and a drain of a corresponding transistor.

10. An input protection circuit comprising:
a first transistor of a field-effect type coupled in series between an input terminal and an electronic circuit, the input terminal receiving an input voltage, the electronic circuit receiving an input voltage, the first transistor switching to an off-state in a case where the input voltage is higher than a positive power supply voltage of the electronic circuit;
a second transistor of a field-effect type coupled in series between the first transistor and the electronic circuit, the second transistor switching to an off-state in a case where the input voltage is lower than the negative power supply voltage of the electronic circuit;
a voltage control circuit configured to maintain gate-source voltages of the first transistor and the second transistor as voltages within a power supply voltage range of the electronic circuit based on the input voltage;
a fourth transistor of a P-type transistor having a drain coupled to a gate of the first transistor;
a first diode coupled between the gate and the source of the first transistor; and
a second diode coupled between a gate and the drain of the second transistor, wherein
the first transistor is an N-type field-effect transistor, the first transistor having a drain coupled to the input terminal,
the first transistor has a source coupled to a drain of the second transistor,
the second transistor is a P-type field-effect transistor, the second transistor having a source coupled to the electronic circuit, and
the voltage control circuit switches the fourth transistor to an off-state in a case where the input voltage is lower than the negative power supply voltage of the electronic circuit.

11. The input protection circuit according to claim 10, wherein
the voltage control circuit includes a first source follower circuit, a second source follower circuit, a first current mirror circuit, a second current mirror circuit, a first resistance, a second resistance, and a third resistance,
the second source follower circuit, the second resistance, and the third resistance are configured to generate a sum of the input voltage and a first predetermined voltage to output the sum to the source of the first transistor,
the first source follower circuit and the first resistance are configured to generate a difference between the input voltage and the first predetermined voltage to output the gate of the second transistor,
the second source follower circuit and the second resistance are configured to generate a sum of the input voltage and a third predetermined voltage to output the sum to a gate of the fourth transistor, and
the first predetermined voltage and the third predetermined voltage are lower than the positive power supply voltage of the electronic circuit and higher than the negative power supply voltage of the electronic circuit.

12. The input protection circuit according to claim 10, wherein
the first diode and the second diode are a row of diodes that includes a plurality of diodes coupled in series in a forward direction.

* * * * *